US008242767B2

(12) United States Patent
Lohl et al.

(10) Patent No.: US 8,242,767 B2
(45) Date of Patent: Aug. 14, 2012

(54) DETECTION OF CHANGES IN AN INTERVAL OF TIME BETWEEN OPTICAL OR ELECTRICAL SIGNALS

(75) Inventors: Florian Lohl, Hamburg (DE); Johann Zemella, Hamburg (DE); Holger Schlarb, Hamburg (DE); Frank Ludwig, Norderstedt (DE); Axel Winter, Hamburg (DE); Matthias Felber, Klein Nordende (DE)

(73) Assignee: Deutsches Elektronen-Snychrotron Desy (DE)

( * ) Notice: Subject to any disclaimer, the term of this patent is extended or adjusted under 35 U.S.C. 154(b) by 483 days.

(21) Appl. No.: 12/545,696

(22) Filed: Aug. 21, 2009

(65) Prior Publication Data

US 2010/0098408 A1 Apr. 22, 2010

(30) Foreign Application Priority Data

Aug. 22, 2008 (DE) ........................ 10 2008 045 359

(51) Int. Cl.
*G01R 19/00* (2006.01)

(52) U.S. Cl. .................................................... 324/76.11

(58) Field of Classification Search ........................ None
See application file for complete search history.

(56) References Cited

U.S. PATENT DOCUMENTS

| | | | | |
|---|---|---|---|---|
| 6,445,478 | B2 * | 9/2002 | Shimizu et al. | 398/192 |
| 7,157,690 | B2 * | 1/2007 | Nishiwaki et al. | 250/226 |
| 7,663,761 | B2 * | 2/2010 | Hacker et al. | 356/450 |
| 2001/0009469 | A1 * | 7/2001 | Shimizu et al. | 359/187 |
| 2005/0218309 | A1 * | 10/2005 | Nishiwaki et al. | 250/226 |
| 2008/0116389 | A1 * | 5/2008 | Hacker et al. | 250/393 |
| 2010/0098411 | A1 * | 4/2010 | Nakashima et al. | 398/25 |

FOREIGN PATENT DOCUMENTS

| | | | |
|---|---|---|---|
| DE | 19938513 | A1 | 2/2001 |
| DE | 102005007072 | A1 | 8/2006 |
| DE | 102006029183 | A1 | 3/2007 |

OTHER PUBLICATIONS

T.R. Schibli, J.Kim, O. Kuzucu, J. T. Gopinath, S.N. Tandon, G.S. Petrich, L.A. Kolodziejski, J.G. Fujimoto, E. P. Ippen, and F.X. Kaertner, "Attosecond active synchronization of passively mode-locked lasers by balanced cross correlation," Optics Letters, vol. 28, No. 11, pp. 947-949 (2003).

* cited by examiner

*Primary Examiner* — Jermele M Hollington
(74) *Attorney, Agent, or Firm* — Hovey Williams LLP

(57) ABSTRACT

A method is disclosed for detecting changes in an interval of time (ΔT) between an optical or electrical signal and an optical or electrical reference signal using a photodetector. The method may be used to synchronize an optical or electrical signal with an optical or electrical reference signal. An apparatus for carrying out the method is also disclosed. The method comprises the steps of: receiving the optical signal and the optical reference signal by means of the photodetector, outputting an electrical response signal at an output of the photodetector, the electrical response signal having a frequency spectrum which depends on the interval of time (ΔT), filtering a selected harmonic from the frequency spectrum of the electrical response signal which has been output, and detecting changes in the interval of time (ΔT) from changes in the amplitude of the selected harmonic.

29 Claims, 7 Drawing Sheets

DETECTION OF CHANGES IN AN INTERVAL OF TIME BETWEEN OPTICAL OR ELECTRICAL SIGNALS

CROSS-REFERENCE TO RELATED APPLICATION

The present application claims the benefit of and priority from German Patent Application Serial No. DE 10 2008 045 359.9, filed Aug. 22, 2008, the entire disclosure of which is hereby incorporated by reference herein.

BACKGROUND OF THE INVENTION

1. Field of the Invention

The present invention relates to a method and an apparatus for detecting changes in an interval of time between an optical or electrical signal and an optical or electrical reference signal. In addition, the invention relates to a use of the method for synchronizing an optical or electrical signal with an optical or electrical reference signal.

2. Discussion of the Prior Art

It is important to synchronize optical or electrical signals in a highly precise manner in numerous time-critical fields of application, for example telecommunications, data transmission, surveying technology, navigation systems or in large research systems. In particular applications, it may be necessary to synchronize an optical or electrical signal with an optical or electrical reference signal in the range of femtoseconds, that is to say $10^{-15}$ s. For such precise synchronization, it is necessary to detect changes in the interval of time between two signals in a highly precise manner in order to then be able to stabilize the interval of time between two signals.

Since, in one femtosecond, light covers a path length of only approximately 0.3 μm, it immediately becomes clear that even minimal changes in length, for example as a result of thermal expansion of optical components, may result in changes in the interval of time between an optical signal and an optical reference signal. This concerns, in particular, the transmission of light signals in a long glass fibre optical waveguide. In order to be able to correct any changes in the length of the transmission path, the change in the interval of time between an optical signal and an optical reference signal must be detected to the femtosecond.

In particular, in order to operate tree electron lasers in the UV or X-ray range, for example the free electron laser in Hamburg (FLASH) and the European free electron laser (XFEL), it is necessary to synchronize various components in the accelerator to the femtosecond. In the case of the XFEL, the components to be synchronized are at a distance of up to 3.5 km from one another, with the result that coaxial distribution systems reach their limits.

A reference pulse laser is typically used to transmit a common optical reference signal to all components to be synchronized. The reference pulse laser itself is usually synchronized with an electrical original reference signal which is predefined by a microwave oscillator, for example. The components to be synchronized with the reference pulse laser beam use either optical or electrical signals which have to be synchronized with the optical reference signal from the reference pulse laser. Such a component in an accelerator could be, for example, an arrival time monitor which is used to determine the arrival time of electron pulses. For this purpose, the arrival time monitor requires an optical or electrical signal which is synchronized, for example, with the signals from other arrival time monitors at other locations in the accelerator. Therefore, all arrival time monitors use the common optical reference signal from the reference pulse laser. However, the problem in this case is that each branch of the reference signal to a component is exposed to different external conditions, for example temperature influences, and the path lengths of the reference signal to the individual components are therefore subjected to fluctuations which are not correlated with one another and interfere with the synchronization of the signals.

It is known from the prior art to use a non-linear crystal to correlate two optical pulse signals which overlap and to use a steep edge of the correlation for highly precise synchronization. However, the disadvantage of the known methods is that the correlation is dependent on the polarization of the signals. In addition, the method is highly dependent on the pulse lengths which, for the rest, have to overlap in terms of time.

SUMMARY

Accordingly, the object of the present invention is to provide a method and an apparatus, which overcome the disadvantages of the prior art and provide an improved use for synchronizing optical or electrical signals to the femtosecond.

According to a first aspect of the present invention, this object is achieved by a method for detecting changes in an interval of time between an optical or electrical signal and an optical or electrical reference signal using a photodetector. The method comprises the following steps:

- if the signal is electrical, an optical signal is modulated on the basis of the electrical signal,
- if the reference signal is electrical, an optical reference signal is modulated on the basis of the electrical reference signal,
- receiving the optical signal and the optical reference signal by means of the photodetector,
- outputting an electrical response signal at an output of the photodetector, the electrical response signal having a frequency spectrum which depends on the interval of time,
- filtering a selected harmonic from the frequency spectrum of the electrical response signal which has been output, and
- detecting changes in the interval of time from changes in the amplitude of the selected harmonic.

The method can be used in four different modes which are shown in the following table:

| Method mode | Signal | Reference signal |
|---|---|---|
| optical-optical | Optical | optical |
| optical-electrical | Optical | electrical |
| electrical-optical | electrical | optical |
| electrical-electrical | electrical | electrical |

In the case of an electrical signal or an electrical reference signal, that is to say in all method modes apart from the optical-optical mode, it is first of all necessary to modulate an optical signal or an optical reference signal on the basis of the electrical signal or electrical reference signal. In this case, the amplitude of the optical signal or optical reference signal is preferably modulated on the basis of the electrical signal or electrical reference signal. It is noted at this point that the interval of time refers to the period of time between an original optical or electrical signal and the original optical or electrical reference signal. In the case of an electrical signal or an electrical reference signal, it may therefore be the case that a change in this interval of time is not expressed in the form of a change in the interval of time between the modulated optical signal and the optical reference signal but rather only in the form of amplitude modulation, for example. If the signal and the reference signal, the interval of time between which is to be detected, are optical, that is to say are in the optical-optical method mode, the modulation steps are not needed.

The optical signal, and the optical reference signal are received using the same photodetector. This avoids differences between different photodetectors and minimizes systematic errors when detecting the interval of time. It is noted at this point that the optical signal and the optical reference signal may have a common source and/or may be branches of the same optical signal.

The inventive method has the advantage over known methods that, inter alia, it is independent of the polarization of the optical signal or of the optical reference signal and is also independent of the respective pulse widths over a wide range. In addition, the pulses of the signal and the pulses of the reference signal need not overlap in terms of time. The proposed method provides a multiplicity of possible temporal offsets between an optical signal and an optical reference signal which are suitable for detecting the temporal change. Only insignificant additional path lengths therefore have to be inserted in order to ensure a suitable operating point.

The optical signal and/or the optical reference signal is/are preferably generated by one or more mode-coupled short-pulse lasers. The optical signal and/or the optical reference signal is/are preferably periodic pulse signals with a pulse width which is relatively small in comparison with the period duration, for example a pulse width of a fraction of a picosecond. In contrast, with a short-pulse laser which is usually operated at a pulse frequency of 50 to 250 MHz, the period duration is 4 to 20 nanoseconds, which corresponds to a path length of the light of 1.2 to 6 meters. Therefore, it is a great advantage of the invention that such long path lengths need not be inserted in order to ensure that the pulses overlap with a width corresponding to a path length of the light of less than 0.3 millimeters.

It is advantageous if the interval of time is set to a value in the range from 0.4 to 0.6, preferably 0.45 to 0.55, of the period duration of the optical signal. It has been found that this makes it possible to achieve a maximum degree of sensitivity to changes if the harmonic is selected appropriately. The selected harmonic is preferably a high-order harmonic, that is to say of the order 5 or higher, for example. This is because it has likewise been shown that the sensitivity to changes is particularly high with the higher-order harmonics, in particular of the order 5 or higher, and a multiplicity of intervals of time can be used as expedient operating points. The largest possible order which can be selected is limited by the bandwidth of the photodetector and the filter width of the filter unit since this restricts the number of orders whose amplitude can still be expediently measured or filtered.

The frequency spectrum may result from the time signal, for example with the aid of Fourier analysis or transformation, the time signal being able to be represented as the sum of harmonics, for example:

$$A(t) = \sum_{n=0}^{\infty} A_n \cdot \sin(n2\pi \cdot f_0 t + \varphi_n), \quad (1)$$

where A(t) is the joint signal comprising the optical signal and the optical reference signal in the form of an amplitude A as a function of the time t, n is the order of the harmonic, $A_n$ is the amplitude of the n-th order harmonic, $f_0$ is a fundamental frequency and $\phi_n$ is the phase shift of the n-th order harmonic. The discrete frequency spectrum than contains the amplitudes $A_n$ of the respective frequency components as a function of the frequency $nf_0$ which corresponds to the frequency of the n-th order harmonic. If the optical signal and the optical reference signal have the same period duration $T_0$ or the same pulse frequency $f_0 1/T_0$, the same amplitude A, and an interval of time ΔT, then: $A_0=cA_t$, $A_k=0$, $A_{2k}=0$, if $\Delta T=T_0/(2k)$ for k=1, 2, . . . , N and $\phi_0=0$. It is noted at this point that the invention is not restricted to harmonics in the representation of equation (1) but rather may have any desired representation.

There are different possibilities for detecting changes in the interval of time from changes in the amplitude of the selected harmonic. One simple possibility is for a change in the amplitude of the selected harmonic to be used as a direct measure of the change in the interval of time. Since the frequency spectrum depends on the interval of time, the envelope changes on the basis of the interval of time. It is now advantageous if a harmonic at a frequency at which the magnitude of the gradient of the envelope of the frequency spectrum is at a maximum is selected for filtering. The amplitude of the selected harmonic is then most sensitive to changes in the interval of time. As an alternative to the suitable selection of the harmonic, the interval of time may also be set in such a manner that a harmonic desired for selection has this property.

The disadvantage of this possibility is the dependence of the optical signal or optical reference signal on amplitude fluctuations. A change in the amplitude of the selected harmonic is only suitable as a direct measure of the change in the interval of time when the amplitude of the optical signal or optical reference signal is very constant. Otherwise, amplitude fluctuations in the optical signal or optical reference signal would be incorrectly interpreted as a change in the interval of time.

Therefore, it may be advantageous if a second selected harmonic is additionally filtered from the frequency spectrum of the electrical response signal which has been output and a change in the difference between the amplitude of the selected harmonic and the amplitude of the second selected harmonic is used as a measure of the change in the interval of time. This is because the difference between the amplitude of the selected harmonic and the amplitude of the second selected harmonic is independent of amplitude fluctuations to the greatest possible extent since the latter have the same effect on the two selected harmonics. The second selected harmonic is preferably of an order which is one smaller or greater than the order of the selected harmonic. This is because it has been found that the difference in amplitude of harmonics of adjacent orders, in particular with an interval of time close to half the period duration, is particularly sensitive to changes in the interval of time. It has likewise been found that possible errors caused by the photodetector and/or the downstream electronics and/or the filter unit are particularly small for adjacent harmonics.

For metrological reasons, it may also be advantageous to select a harmonic or to set the interval of time in such a manner that the magnitude of the envelope of the frequency spectrum is at a minimum at the frequency of the selected harmonic. If the amplitudes of the optical signal and optical reference signal are the same and with a suitable interval of time, the selected harmonic may be erased, with the result that the amplitude can be measured at the zero point, which is advantageous for particular applications. However, the disadvantage is that the signal can be synchronized with the reference signal only using further aids since the change in amplitude at the zero point does not contain any information relating to the direction of a change in the interval of time.

In order to determine the direction of a change in the interval of time, it may be advantageous if the method comprises the following further steps:

receiving the optical signal or the optical reference signal by means of a second photodetector, outputting a second electrical response signal at an output of the second photodetector, the second electrical response signal having a frequency spectrum, filtering a reference harmonic from the frequency spectrum of the second electrical response signal which has been output, the reference harmonic and the selected harmonic being of the same order, mixing the reference harmonic and the selected filtered harmonic in a mixer, outputting an output signal at an output of the mixer, and detecting changes in the interval of time, changes in the amplitude of the output signal being used as a measure of changes in the interval of time.

The reference harmonic and the selected filtered harmonic are preferably multiplied during mixing. If both oscillations are passed into the mixer in phase, the mixer can be used as an "amplitude detector". The product of the reference harmonic and the selected filtered harmonic is an output signal which oscillates around a particular amplitude at twice the frequency. The signed change in amplitude of the output signal can be extracted, for example, using a low-pass filter which removes the oscillating component of the output signal. In this case, the change in amplitude of the output signal has a sign which depends on the direction of the change in the interval of time, with the result that the direction of the change in the interval of time can be determined from the output signal and can be regulated in a corresponding manner.

It is also advantageous if a delay device is used to delay the optical signal and/or the optical reference signal by a selected period of time. Such a delay device may be, for example, an extension of the path length of the optical signal and/or the optical reference signal.

A second aspect of the invention provides a use of the above-described method for synchronizing an optical or electrical signal with an optical or electrical reference signal, the interval of time being regulated on the basis of the change in the interval of time detected by the method. The interval of time is preferably regulated by means of feedback. It may be particularly advantageous to regulate the difference between the amplitudes of two selected harmonics of adjacent orders to zero.

A third aspect of the invention provides an apparatus for detecting changes in an interval of time between an optical or electrical signal and an optical or electrical reference signal, said apparatus comprising a photodetector, a filter unit and a measuring device, at least one electro-optical modulator being provided in the case of an electrical signal and/or an electrical reference signal, said modulator being designed to modulate an optical signal or an optical reference signal on the basis of the electrical signal or electrical reference signal, the photodetector being designed to receive the optical signal and the optical reference signal and to output an electrical response signal at an output of the photodetector, the electrical response signal having a frequency spectrum which is dependent on the interval of time, the filter unit being connected to the output of the photodetector and being designed to filter a selected harmonic from the frequency spectrum of the electrical response signal which has been output, and the measuring device being connected to the filter unit and being designed to detect changes in the interval of time from changes in the amplitude of the selected harmonic.

The photodetector preferably has a wide bandwidth, with the result that the frequency spectrum of the electrical response signal which has been output comprises at least 5 harmonics. The temporal detection resolution is limited by the measurement accuracy of the measuring device, with the result that it is advantageous if the measuring device has a measurement accuracy of at least $\delta A=/A=10^{-3}$, preferably of at least $\delta A/A=10^{-4}$, for the amplitude of the selected harmonic.

It may also be advantageous if the apparatus comprises second filter unit which is connected to the output of the photodetector and is designed to filter a second selected harmonic from the frequency spectrum of the electrical response signal which has been output, the measuring device being connected to the second filter unit and being designed to detect changes in the interval of time from changes in the difference between the amplitude of the selected harmonic and the amplitude of the second selected harmonic. This apparatus makes it possible to carry out the above-described method in such a manner that the detection of changes in the interval of time is independent of amplitude fluctuations in the optical signal or optical reference signal.

At least one filter unit is preferably integrated in the measuring device, that is to say the connection between at least one filter unit and the measuring device is ensured inside the measuring device. It may also be advantageous if the apparatus comprises a delay device which is designed to delay the optical signal and/or the optical reference signal by a selected period of time. The interval of time can thus be set as desired. Such a delay device may be, for example, an extension of the path length of the optical signal and/or the optical reference signal.

In one advantageous embodiment, the apparatus comprises a second photodetector, a further filter unit and a mixer, the second photodetector being designed to receive the optical signal or the optical reference signal and to output a second electrical response signal at an output of the second photodetector, the second electrical response signal having a frequency spectrum, the further filter unit being connected to the output of the second photodetector and being designed to filter a selected reference harmonic from the frequency spectrum of the second electrical response signal which has been output, the reference harmonic and the selected harmonic being of the same order, the mixer having a first input, a second input and an output, the first input being connected to the filter unit and the second input being connected to the further filter unit, and the mixer being designed to mix the reference harmonic and the selected filtered harmonic and to output an output signal at the output of the mixer, changes in the interval of time being able to be detected from changes in the amplitude of the output signal.

The mixer and the further filter unit may be integrated in the measuring device. Furthermore, the measuring device may be connected to a control unit via feedback, the control unit being designed to regulate the interval of time. The control unit may control, for example, the repetition rate of the reference laser. This is expedient, for example, when the reference laser itself is intended to be synchronized with an electrical reference signal from a microwave oscillator, that is to say the apparatus is intended to carry out the method in the optical-electrical mode. On the other hand, the control unit may also readjust an electrical signal which is intended to be synchronized with the optical reference signal from the reference laser, the apparatus thus being intended to carry out the method in the electrical-optical mode.

This summary is provided to introduce a selection of concepts in a simplified form that are further described below in the detailed description of the preferred embodiments. This summary is not intended to identity key features or essential features of the claimed subject matter, nor is it intended to be used to limit the scope of the claimed subject matter.

Various other aspects and advantages of the present invention will be apparent from the following detailed description of the preferred embodiments and the accompanying drawing figures.

BRIEF DESCRIPTION OF THE DRAWING FIGURES

Preferred embodiments of the invention are described in more detail below with reference to the accompanying FIGS. 1 to 12.

DETAILED DESCRIPTION OF THE PREFERRED EMBODIMENTS

The present invention is susceptible of embodiment in many different forms. While the drawings illustrate, and the specification describes, certain preferred embodiments of the invention, it is to be understood that such disclosure is by way of example only. There is no intent to limit the principles of the present invention to the particular disclosed embodiments.

Figure 1:
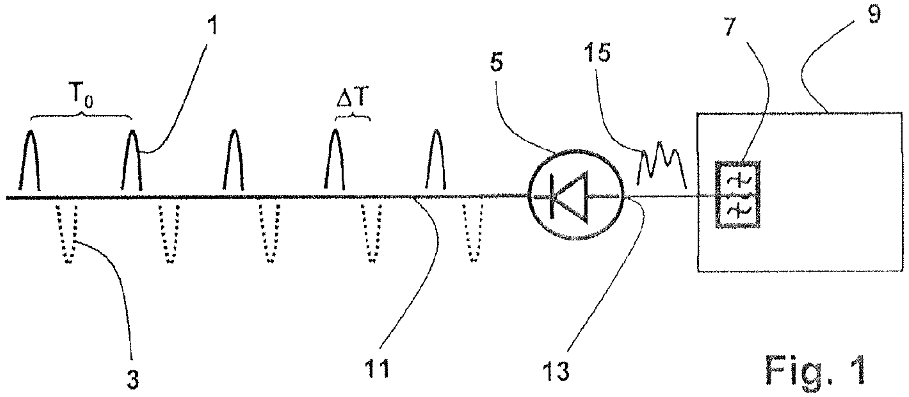
FIGS. 1 and 2 show two schematic illustrations of first and second advantageous embodiments of the invention.

FIG. 1 shows a first preferred embodiment of the invention, an optical signal 1 and an optical reference signal 3 arriving at a photodetector 5 whose output is connected to a filter unit 7 in a measuring device 9. In this example, the optical signal 1 and the optical reference signal 3 are laser pulses with the same period duration $T_0$ or a pulse rate of $f_0=1/T_0$, the optical signal 1 and the optical reference signal 3 being guided to the photodetector 5 by the same optical waveguide 11. The amplitudes $A_t$ of the optical signal 1 and of the optical reference signal 3 are constant over time and are of the same magnitude. There is an interval of time of $\Delta T$ between the pulses of the optical signal 1 and those of the optical reference signal 3.

If the photodetector 5 now receives the optical signal 1 and the optical reference signal 3, it outputs an electrical response signal 15 at an output 13 of the photodetector 5. The electrical response signal 15 has a frequency spectrum which depends on the interval of time $\Delta T$. The filter unit 7 is now used to filter a selected harmonic from the frequency spectrum of the electrical response signal 15 which has been output and the amplitude thereof is measured using the measuring device 9. Changes in the interval of time $\Delta T$ can then be detected from changes in the measured amplitude of the selected harmonic. For example, this is possible as a direct measure from changes in the measured amplitude if the amplitude $A_t$ of the optical signal 1 and of the optical reference signal 3 is constant over time.

Figure 7:
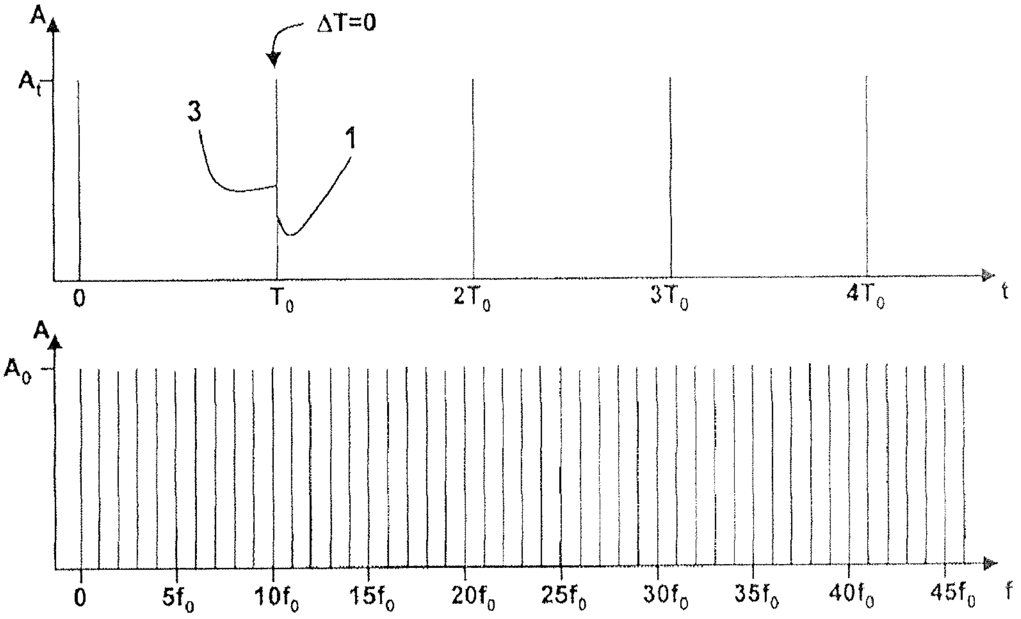
FIGS. 7 to 11 show schematic illustrations of optical signals and optical reference signals, each as a function of the time and as a function of the frequency for different values of the interval of time.
Figure 8:
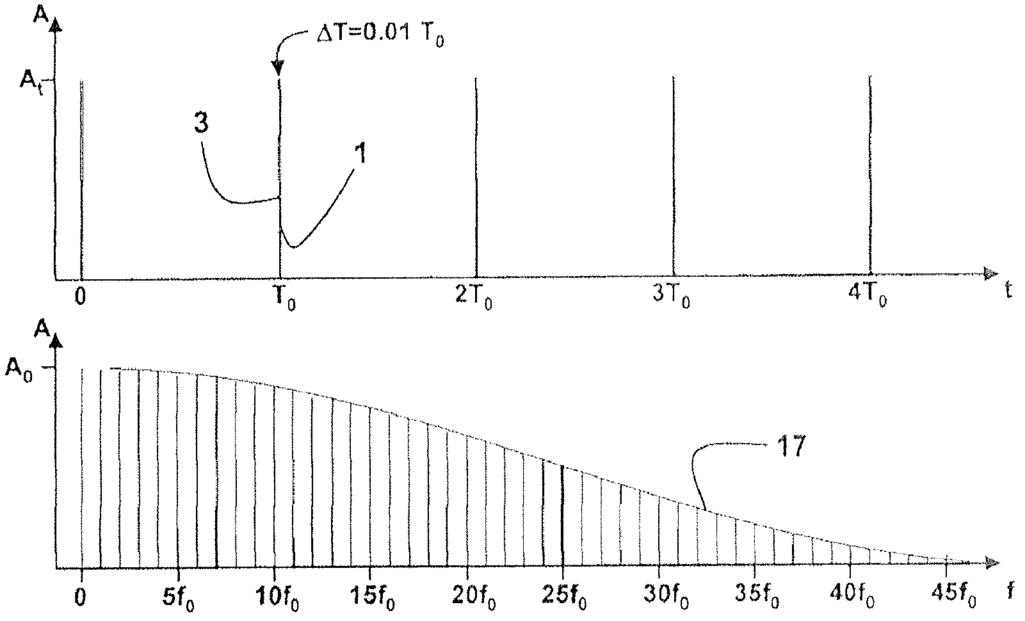

By way of example, FIGS. 7 to 11 show the amplitude of the optical signal 1 and of the optical reference signal 3 as a function of the time t at the top and as a function of the frequency f at the bottom for intervals of time of $\Delta T=0$, $0.01\cdot T_0$, $0.02\cdot T_0$, $0.2\cdot T_0$ and $0.48\cdot_0$. The optical signal 1 and the optical reference signal 3 have the same amplitude $A_t$, the same pulse shape and the same period duration $T_0$ or a pulse rate of $f_0=1/T_0$. In FIG. 7, the interval of time is $\Delta T=0$, with the result that the pulses of the optical signal 1 and those of the optical reference signal 3 are exactly on top of one another. Therefore, the lower illustration of the amplitude of the electrical response signal 15 represents the discrete frequency spectrum, the harmonics up to the 46th order being shown. This embodiment of the invention is less suitable for an interval of time of $\Delta T=0$, as shown in FIG. 7, since the amplitude of all harmonics is $A_0$. A very slight change from the interval of time of $\Delta T=0$ would have an effect only on the amplitude of very high-order harmonics which are possibly no longer covered by the bandwidth of the photodetector 5 or can no longer be filtered by the filter unit 7 and therefore can no longer be expediently detected. FIG. 8 shows what the frequency spectrum looks like for a value of the interval of time of $\Delta T=0.01\cdot T_0$. For $\Delta T=0.01\cdot T_0$, the frequency spectrum has an envelope 17 which has the shape of a cosine curve $A(f)=0.5\cdot A_0(1+\cos(0.01\cdot 2\pi f/f_0))$. The harmonics of the orders 50, 150, 250, . . . , etc. are thus each erased. The amplitude of the 25th harmonic is most sensitive to changes in the interval of time of $\Delta T=0.01\cdot T_0$ within the bandwidth of the photodetector since the magnitude of the gradient of the envelope 17 is greatest at the frequency $f=25\cdot f_0$.

Figure 9:
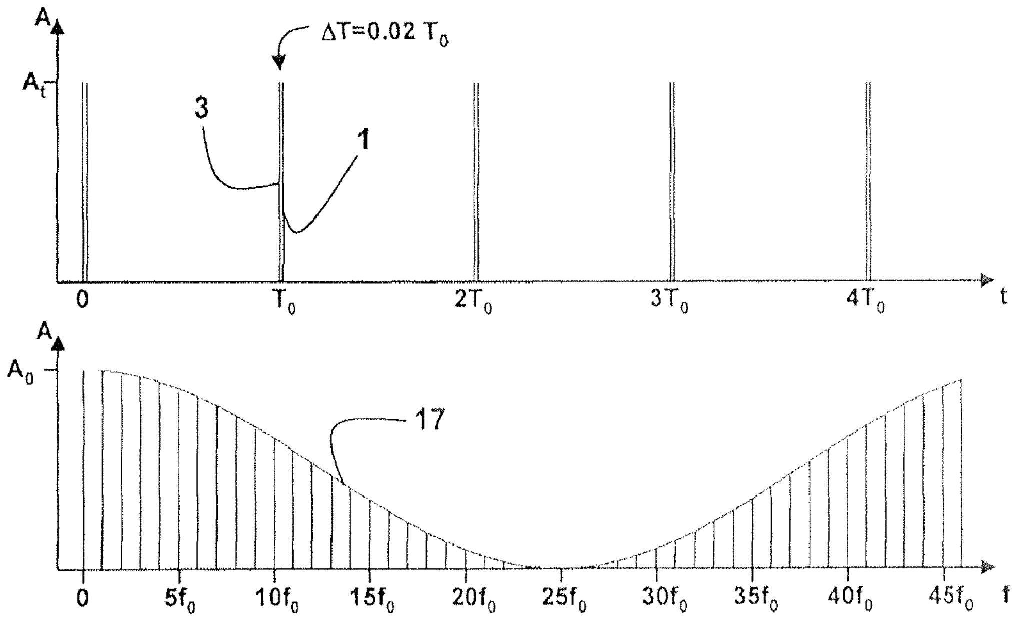
Figure 10:
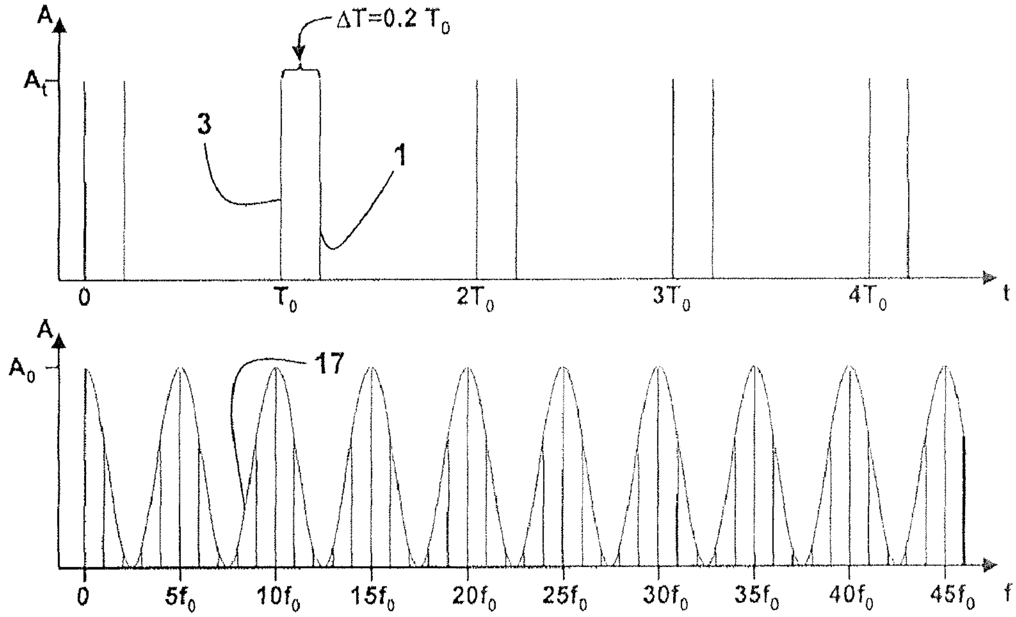
Figure 11:
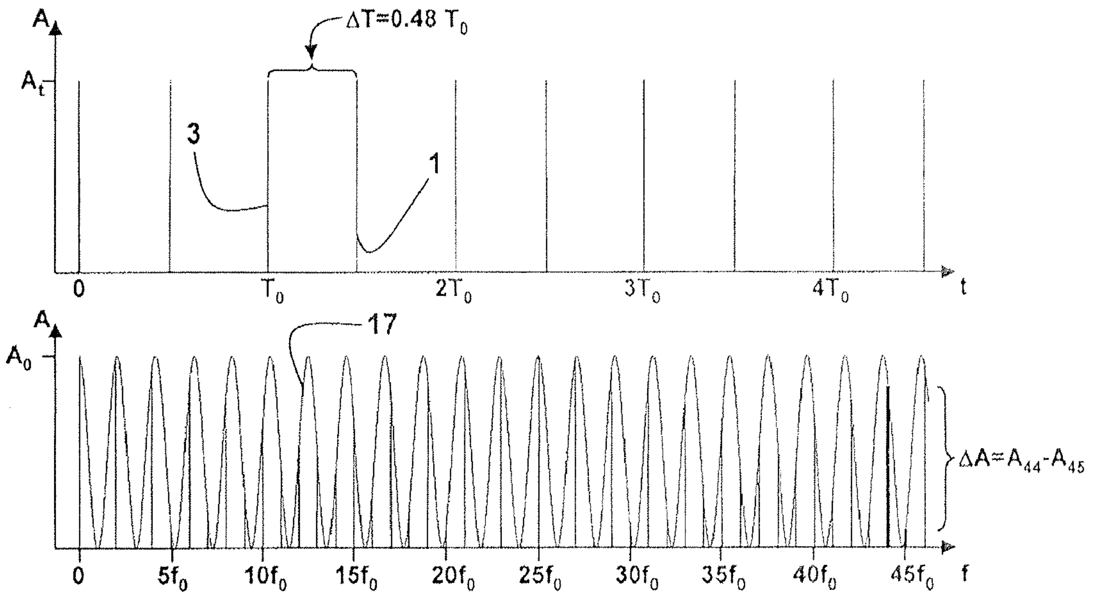

It becomes clear from FIGS. 9 to 11 that the following applies to the shape of the envelope 17 as a function of the frequency f and of the interval of time $\Delta T$:

$$A(f,\Delta T)=0.5\cdot A_0(1+\cos(\Delta T/T_0\cdot 2\pi f/f_0)). \quad (2)$$

This means that the envelope 17 has a period length of $f_0\cdot T_0/\Delta T$. With an interval of time of, for example, $\Delta T-T_0/2$, precisely every second harmonic is erased, namely those of an uneven order. FIG. 9 shows, for example, how the 25th harmonic is erased when the interval of time is $\Delta T=0.02\cdot T_0$.

It becomes immediately clear from FIGS. 7 to 11 that, if a harmonic is appropriately selected, the sensitivity to changes in the interval of time is, in principle, greater for higher-order harmonics, that is to say at least of the order 5 or higher. Those harmonics at which the magnitude of the gradient of the envelope 17 is at a maximum, for example the orders 1, 4, 6, 9, 11, 14, 16, . . . , etc. for $\Delta T=0.2\cdot T_0$ in FIG. 10, may be particularly suitable. Of these particularly suitable harmonics, the highest order which can still be expediently measured within the bandwidth of the photodetector, for example the 46th order, is most sensitive to a change in the interval of time $\Delta T$.

As shown in FIG. 9, it may also be expedient, however, to select a harmonic which is erased for the interval of time $\Delta T$ which has been set. Although the envelope 17 is at a minimum at this point, that is to say the magnitude of the gradient is zero, with the result that the sensitivity to changes in the interval of time $\Delta T$ is relatively low, it can be used to regulate to the zero point. This may be advantageous in terms of metrology. However, the problem is that a change in the amplitude as a result of a change in the interval of time $\Delta T$ does not contain any information relating to the direction of the change in the interval of time $\Delta T$. Further aids are therefore needed to determine the direction of the change in the interval of time $\Delta T$.

It also becomes clear that the sensitivity is particularly high for values of the interval of time in the vicinity of $\Delta T=T_0/2$, that is to say in the range from 0.4 to 0.6, or preferably 0.45 to 0.55, since the envelope 17 has a short period length and thus steep gradients in this range.

Figure 2:
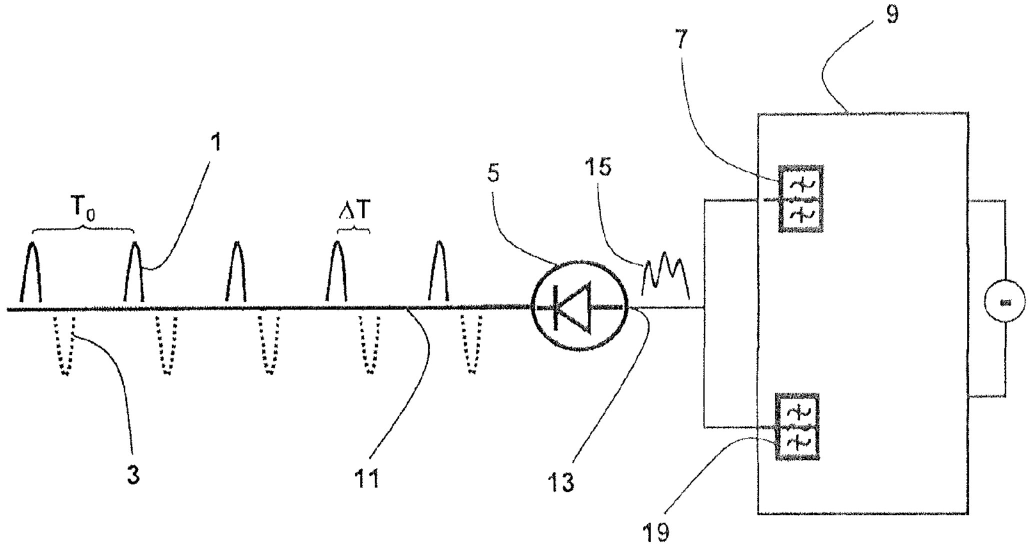

FIG. 2 shows a second advantageous embodiment of the invention, the apparatus having a second filter unit 19 which is connected to the measuring device 9 and is integrated in the latter and is also connected to the output of the photodetector 5. The second filter unit 19 is designed to filter a second selected harmonic from the frequency spectrum of the electrical response signal 15 which has been output. The measuring device 9 is designed to form the difference between the amplitude of the selected harmonic and the amplitude of the second selected harmonic and to detect changes in the interval of time $\Delta T$ from changes in the difference.

Figure 12:
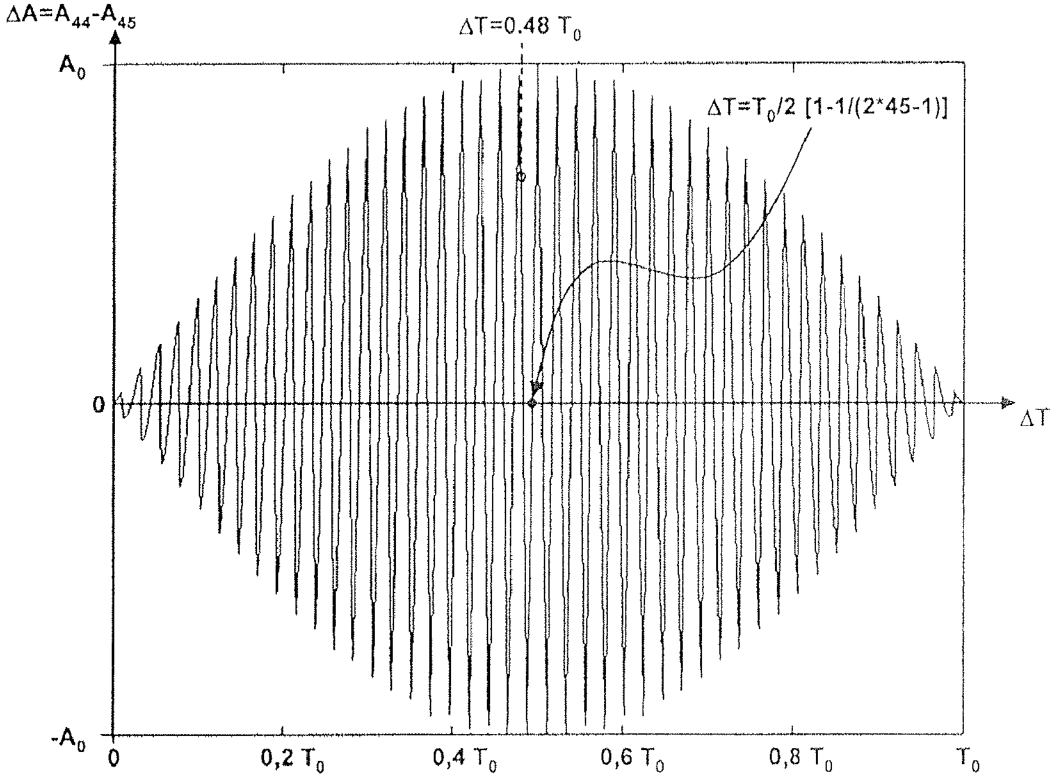
FIG. 12 shows the difference in amplitude between the selected harmonics of the order 44 and 45 as a function of the interval of time.

FIGS. 11 and 12 show how, for an interval of time of $\Delta T=0.48\cdot T_0$, the 45th harmonic and the 44th harmonic are selected and filtered, the amplitudes $A_{45}$ and $A_{44}$ are measured and the difference $\Delta A=A_{44}-A_{45}$ is formed. The difference $\Delta A$ is independent of fluctuations in the amplitude $A_L$ of the optical signal 1 or of the optical reference signal 3 to the greatest possible extent since said fluctuations have the same effect on the two amplitudes $A_{45}$ and $A_{44}$ and thus leave the difference $\Delta A$ untouched. FIG. 12 shows the difference $\Delta A=A_{44}-A_{45}$ as a function of the interval of time $\Delta T$. It becomes particularly clear here how greatly the difference $\Delta A$ depends on the interval of time $\Delta T$. The operating point for $\Delta T=0.48\cdot T_0$ from FIG. 11 is plotted as an open circle. The difference $\Delta A$ has the highest sensitivity to changes in $\Delta T$ at one of the (2k−1) zero crossings, in which case k=45 for the selected 45th order since the magnitude of the gradient is at a maximum there. There is additionally the advantage of being able to regulate to a value of $\Delta A=0$. The gradient is steepest at a zero crossing close to $\Delta T=T_0/2$, that is to say $$\frac{d(\Delta A)}{d(\Delta T)} \approx 4\pi(2k-1)\frac{A_S}{T_0}. \tag{3}$$

It becomes immediately clear from equation (3) that the sensitivity is greater for higher-order harmonics than for lower-order harmonics. A preferred operating point (illustrated as a black dot in FIG. 12) could be at the zero crossing at $\Delta T=T_0/2[1-1/(2k-1)]$ at which it is possible to regulate to $\Delta A=0$ in an operating range of $\Delta T\in[T_0/2-T_0/(2k-1), T_0/2]$. The multiplicity of $\Delta T$ values as a possible operating point also becomes clear from FIG. 12.

Figure 3:
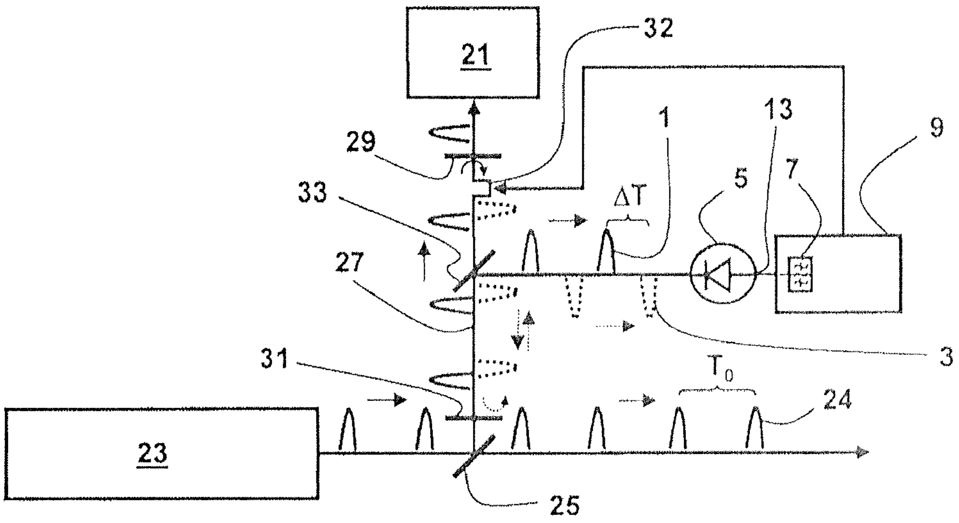
FIG. 3 shows a schematic illustration of a possible use of the invention for correcting the length of the path of the signal.

FIG. 3 shows a possible use of the invention for correcting the length of the path of an optical signal 1 needed by an arrival time monitor 21 in order to be synchronized with other components (not shown). For this purpose, an optical original signal 24 is generated by a mode-coupled short-pulse laser 23, from which the optical signal 1 is branched using a first semi-transparent mirror 25. The original signal 24 is also passed to the other components which branch an optical signal 1 for synchronization in the same manner. The signal 1 is passed from the first mirror 25 to the arrival time monitor 21 via an optical waveguide 27. If the length of the optical waveguide 27 now changes, for example as a result of the influence of temperature, this may impair the synchronization with other components. The method according to the invention can thus be used to detect any change in the length of the optical waveguide 27. For this purpose, a second semi-transparent mirror 29 which is at that end of the optical waveguide 27 which is at the arrival time monitor 21 is used to generate a reference signal 3 which represents a reflection of the signal 1 by 180°. The reference signal 3 thus runs counter to the signal 1 in the other direction in the optical waveguide 27. A third mirror 31 which is at that end of the optical waveguide 27 which is at the first mirror 25 reflects the reference signal 3 by 180° again in the direction of the signal 1. A fourth semi-transparent mirror 33 at any desired point of the optical waveguide 27 between the second mirror 29 and the third mirror 31 then branches both the signal 1 and the reference signal 3 to a photodetector 5. In contrast to the signal 1, the reference signal 3 has run through the path length between the second mirror 29 and the third mirror 31, that is to say approximately the length of the optical waveguide 27, twice before the photodetector 5 is reached. The positions of the second mirror 29 and/or of the third mirror 31 can be set in such a manner that the pulses of the signal 1 and those of the reference signal 3 have a desired interval of time $\Delta T$. This is preferably an interval in the range from 0.45 to 0.55 of the period duration $T_0$ of the signal 1 or of the reference signal 3. A measuring device 9 which is connected to the output 13 of the photodetector 5 can now use the method according to the invention to detect a change in the interval of time $\Delta T$. Such a change results when, for example, the length of the optical waveguide 27 changes since the reference signal 3 has passed through the latter twice more than the signal 1. This detected change can now be passed, for example, as information to an actuator 32 which is designed to readjust the length of the path of the light between the second mirror 29 and the third mirror 31 in order to compensate for the change in the length of the optical waveguide 27.

Figure 4:
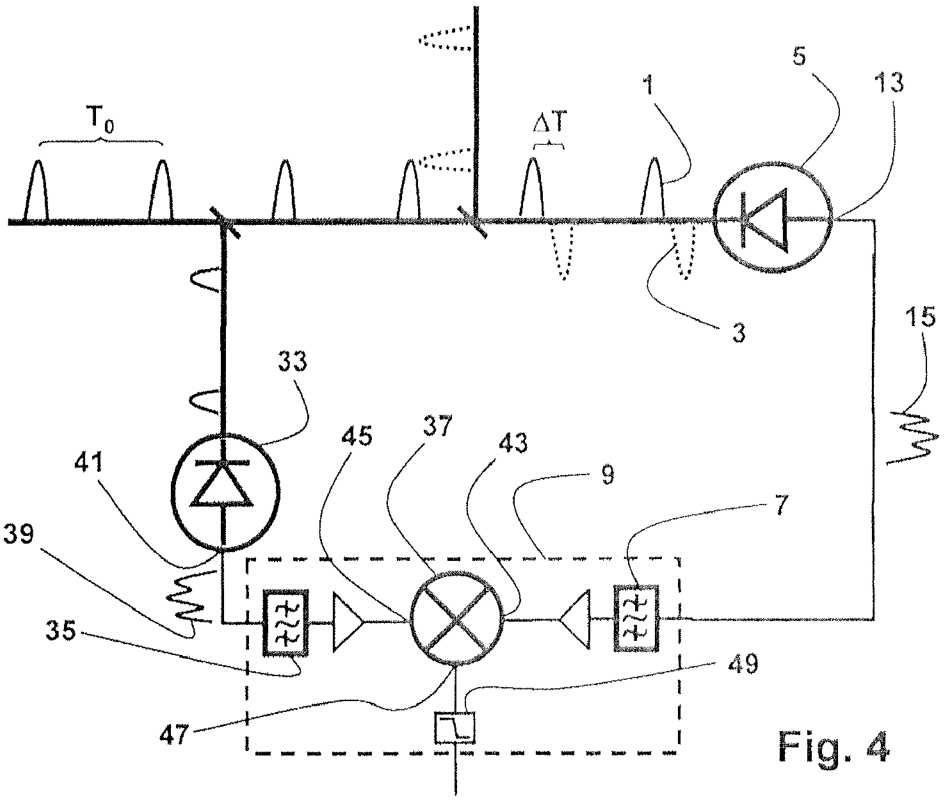
FIG. 4 shows a schematic illustration of a third embodiment of the invention.

FIG. 4 shows a third preferred embodiment of the invention, a second photodetector 33, a further filter unit 35 and a mixer 37 being used to detect changes in the interval of time. This may be advantageous, for example, when the amplitude of the selected harmonic is erased at the desired value of the interval of time $\Delta T$ and is intended to be regulated to this zero value. The sign of the change in the amplitude of an output signal at the mixer 37 then provides information relating to the direction of a change in the interval of time $\Delta T$. For example, a low-pass filter 49 which removes the oscillating component of the output signal can be used to extract the signed change in amplitude of the output signal. The change in amplitude of the output signal then has a sign which depends on the direction of the change in the interval of time, with the result that the direction of the change in the interval of time can be determined from the output signal and can be regulated in a corresponding manner.

The second photodetector 33 is designed to receive a branched optical signal 1 and to output a second electrical response signal 39 at an output 41 of the second photodetector 33. The second electrical response signal 39 also has a frequency spectrum in this case. The further filter unit 35 is connected to the output 41 of the second photodetector and is designed to filter a selected reference harmonic from the frequency spectrum of the second electrical response signal 39 which has been output. In this case, the reference harmonic is of the same order as the selected harmonic from the frequency spectrum output by the first photodetector 5 with the electrical response signal 15. The mixer 37 has a first input 43, a second input 45 and an output 47, the first input 43 being connected to the first filter unit 7 and the second input 45 being connected to the further filter unit 35. The mixer 37 is designed to mix the reference harmonic and the selected filtered harmonic and to output the output signal at the output 47 of the mixer 37, a change in the interval of time ΔT being able to be detected from the signed change in amplitude of the output signal. The mixer 37 and the further filter unit 35 may also be integrated in a measuring device 9.

Figure 5:
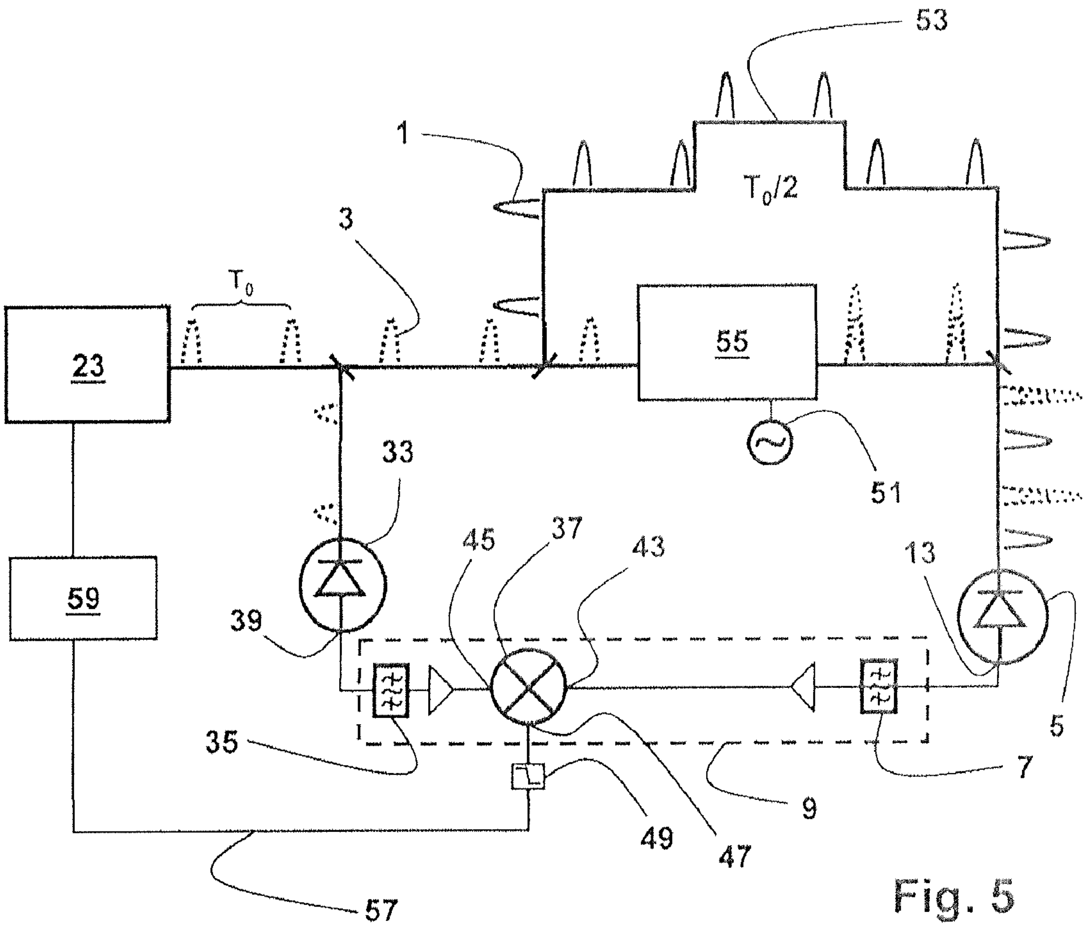
FIGS. 5 and 6 show schematic illustrations of a fourth embodiment of the invention with two different uses for synchronization.
Figure 6:
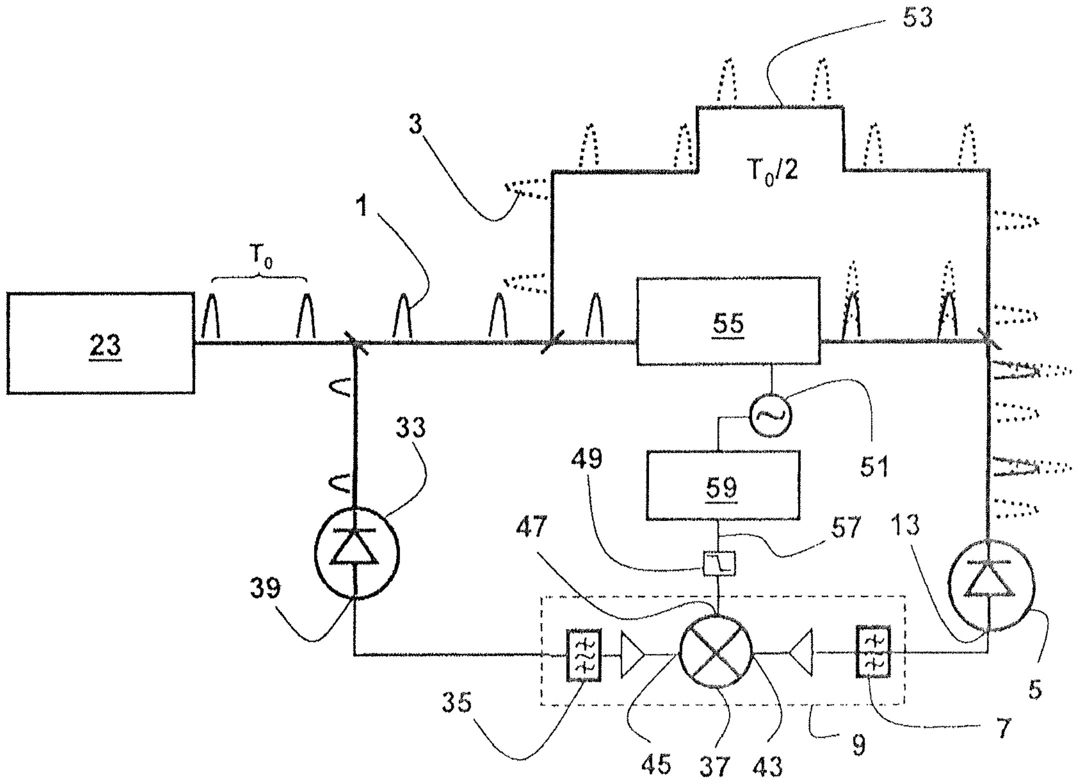

FIGS. 5 and 6 show a fourth embodiment of the invention with different uses for synchronization. FIG. 5 shows how the repetition rate of a short-pulse laser 23 is synchronized with an electrical reference signal from a microwave oscillator 51, that is to say the method is used in the optical-electrical mode. In a similar manner to the third embodiment shown in FIG. 4, a second photodetector 33 and a further filter unit are first of all used to filter a selected reference harmonic from a branched optical reference signal 3 which originates from the short-pulse laser 23. The optical signal 1 which is passed via a delay device 53, for example in the form of an extension of the optical path length, is also branched from the reference signal 3. The optical reference signal 3 then passes through an electro-optical modulator 55 which modulates the amplitude $A_r$ of the pulses of the reference signal 3 on the basis of the electrical reference signal which is generated by the microwave oscillator 51 and is applied to the input of the electro-optical modulator 55. The optical signal 1 is then combined again with the now amplitude-modulated optical reference signal 3. In this case, the delay device 53 is set in such a manner that there is a path difference of $T_0/2$ between the pulses of the amplitude-modulated optical reference signal 3 and the pulses of the optical signal 1. This path difference should not be confused with the interval of time ΔT which, in this embodiment, relates to the optical signal 1 and to the electrical reference signal. Laser pulses thus arrive at the first photodetector 5 at a frequency of $2f_0$, every second pulse of which is amplitude-modulated on the basis of the electrical reference signal. The period duration $T_0$ of the optical reference signal 3 and that of the electrical reference signal are the same and, if possible, the amplitude modulation extends over the same amplitude. The electro-optical modulator 55 could modulate the optical reference signal 3, for example, in such a manner that, for an interval of time of ΔT=0, all modulated pulses have an amplitude of $A_r/2$, the pulses of the reference signal 3 coinciding exactly with the zero crossings of the electrical reference signal. The amplitude of the optical reference signal 3 is modulated up or down depending on how the interval of time ΔT between the optical signal 1 and the electrical reference signal changes. If the amplitude of the optical signal 1 is likewise set to an amplitude of $A_r/2$, a frequency spectrum in which every second harmonic is erased, namely those of an uneven order, results for an interval of time of ΔT=0. If a harmonic of uneven order is now selected from the frequency spectrum output by the first photodetector 5 with the electrical response signal 15, it is possible to regulate to a minimum amplitude, as already described above. This is because, as soon as an interval of time of ΔT≠0 results, the amplitude modulation of the reference signal 3 results in an increase in the amplitude of the selected harmonic of uneven order.

In a similar manner to the third embodiment, it is then possible to regulate to a zero value or minimum value of the amplitude of the selected harmonic which is erased at a desired value of the interval of time of ΔT=0. In this case, the reference harmonic received by the second photodetector 33 and filtered using the further filter unit 35 is of the same order as the selected harmonic from the frequency spectrum output by the first photodetector 5 with the electrical response signal 15. Since, in embodiments of the method in the optical-electrical or electrical-optical mode in which the optical reference signal 3 or the optical signal 1 is amplitude-modulated, a change in the interval, of time ΔT is not expressed by a change in the path difference between the pulses of the optical signal 1 and those of the optical reference signal 3, the sensitivity to changes in the path difference should be minimized in this case. A change in the path difference may be caused, for example, by a change in the length of the path of the optical signal 1 or of the optical reference signal 3. For these embodiments, it may therefore be advantageous if a low-order harmonic is selected in order to minimize, for example, the influence of changes in the length of the path of the optical signal 1 or of the optical reference signal 3. In order to also detect a change in the interval of time ΔT here from a change in a signed change in amplitude of an output signal from a mixer 37, provision is also made here of a mixer 37 having a first input 43, a second input 45 and an output 47, the first input 43 being connected to the first filter unit 7 and the second input 45 being connected to the further filter unit 35. The mixer 37 is designed to mix the reference harmonic and the selected filtered harmonic and to output an output signal at the output 47 of the mixer 37, a change in the interval of time ΔT being able to be detected from the signed change in amplitude of the output signal. The mixer 37 and the further filter unit 35 are integrated in a measuring device 9 here.

In the case of the synchronization of the repetition rate of the short-pulse laser 23 with the electrical reference signal from the microwave oscillator 51, as shown in FIG. 5, the output 47 of the mixer 37 is connected to a control unit 59 of the short-pulse laser 23 via feedback 57, said control unit being designed to control the repetition rate DC the short-pulse laser 23 using the output signal and thus to regulate the interval of time ΔT.

Apart from the feedback, FIG. 6 corresponds to FIG. 5, the roles of the optical signal 1 and of the optical reference signal 3 being interchanged. In this case, it is thus riot the optical signal 1 which is synchronized with an electrical reference signal but rather conversely an electrical signal which is synchronized with the optical reference signal 3, that is to say the method is used in the electrical-optical mode. In this case, the optical reference signal 3 is branched from the optical signal 1 from the short-pulse laser 23, the optical signal 1 being amplitude-modulated by an electro-optical modulator 55 in a manner corresponding to the electrical signal. In order to accordingly synchronize the electrical signal, the output 47 of the mixer 37 is connected in this case to a control unit 59 of the microwave oscillator via feedback 57, said control unit being designed to control the phase shift of the microwave oscillator 51 by means of the signed change in amplitude of the output signal and thus to regulate the interval of time ΔT.

The preferred forms of the invention described above are to be used as illustration only, and should not be utilized in a limiting sense in interpreting the scope of the present invention. Obvious modifications to the exemplary embodiments, as hereinabove set forth, could be readily made by those skilled in the art without departing from the spirit of the present invention.

The inventors hereby state their intent to rely on the Doctrine of Equivalents to determine and access the reasonably fair scope of the present invention as pertains to any apparatus not materially departing from but outside the literal scope of the invention set forth in the following claims.

The invention claimed is:

1. A method for detecting changes in an interval of time (ΔT) between an optical or electrical signal and an optical or electrical reference signal using a photodetector, said method comprising the steps of:

if the signal is electrical, modulating an optical signal on the basis of the electrical signal, if the reference signal is electrical, modulating an optical reference signal on the basis of the electrical reference signal, receiving the optical signal and the optical reference signal by means of the photodetector, outputting an electrical response signal at an output of the photodetector, the electrical response signal having a frequency spectrum which depends on the interval of time (ΔT), filtering a selected harmonic from the frequency spectrum of the electrical response signal which has been output, and detecting changes in the interval of time (ΔT) from changes in the amplitude of the selected harmonic.

2. The method according to claim 1, generating the optical signal and/or the optical reference signal by one or more mode-coupled short-pulse lasers.

3. The method according to claim 1, the interval of time (ΔT) being set to a value in the range from 0.4 to 0.6 of the period duration ($T_0$) of the optical signal.

4. The method according to claim 3, the interval of time (ΔT) being set to a value in the range from 0.45 to 0.55 of the period duration ($T_0$) of the optical signal.

5. The method according to claim 1, the selected harmonic being a high-order harmonic of the order 5 or higher.

6. The method according to claim 1, modulating the amplitude of the optical signal on the basis of the electrical signal in the case of an electrical signal and modulating the amplitude of the optical reference signal on the basis of the electrical reference signal in the case of an electrical reference signal.

7. The method according to claim 1, a change in the amplitude of the selected harmonic being used as a direct measure of the change in the interval of time (ΔT).

8. The method according to claim 1, filtering a second selected harmonic from the frequency spectrum of the electrical response signal which has been output and using a change in the difference (ΔA) between the amplitude of the selected harmonic and the amplitude of the second selected harmonic as a measure of the change in the interval of time (ΔT).

9. The method according to claim 8, the second selected harmonic being of an order which is one smaller or greater than the order of the selected harmonic.

10. The method according to claim 1, said harmonic being selected or the interval of time being set in such a manner that the magnitude of the gradient of the envelope of the frequency spectrum is at a maximum at the frequency of the selected harmonic.

11. The method according to claim 8, at least one of the harmonics being selected or the interval of time being set in such a manner that the magnitude of the gradient of the envelope of the frequency spectrum is at a maximum at the frequency of the selected harmonic.

12. The method according to claim 1, said harmonic being selected or the interval of time (ΔT) being set in such a manner that the magnitude of the envelope of the frequency spectrum is at a minimum at the frequency of the selected harmonic.

13. The method according to claim 8, at least one of the harmonics being selected or the interval of time (ΔT) being set in such a manner that the magnitude of the envelope of the frequency spectrum is at a minimum at the frequency of the selected harmonic.

14. The method according to claim 1, the method comprising the following further steps:

receiving the optical signal or the optical reference signal by means of a second photodetector, outputting a second electrical response signal at an output of the second photodetector, the second electrical response signal having a frequency spectrum, filtering a reference harmonic from the frequency spectrum of the second electrical response signal which has been output, the reference harmonic and the selected harmonic being of the same order, mixing the reference harmonic and the selected filtered harmonic in a mixer, outputting an output signal at an output of the mixer, and detecting changes in the interval of time (ΔT), changes in the amplitude of the output signal being used as a measure of changes in the interval of time (ΔT).

15. The method according to claim 14, the reference harmonic and the selected filtered harmonic being multiplied during mixing.

16. The method according to claim 1, using a delay device to delay the optical signal and/or the optical reference signal by a selected period of time.

17. The method according to claim 1, wherein the method is used to synchronize an optical or electrical signal with an optical or electrical reference signal, the interval of time (ΔT) being regulated on the basis of the change in the interval of time (ΔT) detected by the method.

18. The method according to claim 17, the interval of time (ΔT) being regulated by means of a feedback.

19. The method according to claim 17, the difference (ΔA) between the amplitudes of two selected harmonics of adjacent orders being regulated to zero.

20. An apparatus for detecting changes in an interval of time (ΔT) between an optical or electrical signal and an optical or electrical reference signal, said apparatus comprising:

a photodetector, a filter unit and a measuring device, the photodetector being designed to receive the optical signal and the optical reference signal and to output an electrical response signal at an output of the photodetector, the electrical response signal having a frequency spectrum which is dependent on the interval of time (Δ7), the filter unit being connected to the output of the photodetector and being designed to filter a selected harmonic from the frequency spectrum of the electrical response signal which has been output, the measuring device being connected to the filter unit and being designed to detect changes in the interval of time (ΔT) from changes in the amplitude of the selected harmonic, and the measuring device presenting a measurement accuracy of at least $\delta A/A=10^{-3}$, or of at least $\delta A/A=10^{-4}$, for the amplitude of the selected harmonic.

21. The apparatus according to claim 20, the apparatus comprising at least one electro-optical modulator, said modulator being designed to modulate an optical signal or an optical reference signal on the basis of the electrical signal or electrical reference signal.

22. The apparatus according to claim 20, the photodetector presenting a wide bandwidth, with the result that the frequency spectrum of the electrical response signal which has been output comprises at least 5 harmonics.

23. The apparatus according to claim 20, the apparatus comprising a second filter unit which is connected to the output of the photodetector and is designed to filter a second selected harmonic from the frequency spectrum of the electrical response signal which has been output, the measuring device being connected to the second filter unit and being designed to detect changes in the interval of time (ΔT) from changes in the difference (ΔA) between the amplitude of the selected harmonic and the amplitude of the second selected harmonic.

24. The apparatus according to claim 20, the filter unit being integrated in the measuring device.

25. The apparatus according to claim 23, at least one of the filter units being integrated in the measuring device.

26. The apparatus according to claim 20, the apparatus comprising a delay device which is designed to delay the optical signal and/or the optical reference signal by a selected period of time.

27. The apparatus according to claim 20, the apparatus comprising a second photodetector, a further filter unit and a mixer, the second photodetector being designed to receive the optical signal or the optical reference signal and to output a second electrical response signal at an output of the second photodetector, the second electrical response signal having a frequency spectrum, the further filter unit being connected to the output of the second photodetector and being designed to filter a selected reference harmonic from the frequency spectrum of the second electrical response signal which has been output, the reference harmonic and the selected harmonic being of the same order, the mixer comprising a first input, a second input and an output, the first input being connected to the filter unit and the second input being connected to the further filter unit, and the mixer being designed to mix the reference harmonic and the selected filtered harmonic and to output an output signal at the output of the mixer, changes in the interval of time (ΔT) being able to be detected from changes in the amplitude of the output signal.

28. The apparatus according to claim 27, the mixer and the further filter unit being integrated in the measuring device.

29. The apparatus according to claim 20, the measuring device being connected to a control unit via feedback, the control unit being designed to regulate the interval of time (ΔT).

* * * * *